(12) United States Patent
Beom et al.

(10) Patent No.: US 8,304,800 B2
(45) Date of Patent: Nov. 6, 2012

(54) LIGHT EMITTING DEVICE, LIGHT EMITTING DEVICE PACKAGE, AND LIGHTING DEVICE SYSTEM

(75) Inventors: Hee Young Beom, Seoul (KR); Sung Kyoon Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 27 days.

(21) Appl. No.: 13/082,583

(22) Filed: Apr. 8, 2011

(65) Prior Publication Data
US 2011/0284894 A1 Nov. 24, 2011

(30) Foreign Application Priority Data
May 24, 2010 (KR) .................. 10-2010-0048057

(51) Int. Cl.
*H01L 33/00* (2010.01)

(52) U.S. Cl. .............. 257/98; 257/86; 257/103; 438/22; 438/42; 438/46

(58) Field of Classification Search .................... 257/98, 257/103, 86, E33.006; 438/46, 42, 22
See application file for complete search history.

(56) References Cited

U.S. PATENT DOCUMENTS
2010/0193826 A1* 8/2010 Kim ................. 257/99
2010/0244083 A1* 9/2010 Kim ................. 257/99

FOREIGN PATENT DOCUMENTS
| JP | 2003-347589 A | 12/2003 |
|---|---|---|
| JP | 2008-205229 A | 9/2008 |
| KR | 10-0663910 B1 | 12/2006 |
| KR | 10-0665361 B1 | 12/2006 |
| KR | 10-0714626 B1 | 5/2007 |

* cited by examiner

*Primary Examiner* — Theresa T Doan
(74) *Attorney, Agent, or Firm* — KED & Associates, LLP

(57) ABSTRACT

A light emitting device includes a substrate, a light emitting structure including a first conductive semiconductor layer having an exposed region, an active layer, and a second conductive semiconductor layer on the substrate, a first electrode on the exposed region of the first conductive semiconductor layer, and a second electrode on the second conductive semiconductor layer, wherein a side of the light emitting structure includes a first sloped side sloped from a reference plane, the first sloped side includes a concave-convex pattern having a concave-convex structure in which a first direction length is greater than a second direction length, the reference plane is a plane perpendicular to a direction in which the substrate faces the light emitting structure, and the first direction is a sloped direction of the first sloped side and the second direction is a lateral direction of the first sloped side.

20 Claims, 20 Drawing Sheets

LIGHT EMITTING DEVICE, LIGHT EMITTING DEVICE PACKAGE, AND LIGHTING DEVICE SYSTEM

CROSS REFERENCE TO RELATED APPLICATION

Pursuant to 35 U.S.C. §119(a), This application claims the benefit of the Patent Korean Application No. 10-2010-0048057, filed on May 24, 2010, which is hereby incorporated by reference as if fully set forth herein.

BACKGROUND OF THE DISCLOSURE

1. Field of the Disclosure

The present invention relates to a light emitting device, a light emitting device package, and a lighting device.

2. Discussion of the Related Art

The light emitting device, such as a light emitting diode of third to fifth group or second to sixth group compound semiconductor material or a laser diode, can produce different colors, such as red, blue, green, and ultra-violet owing to development of the thin film growth technology and materials therefore, as well as a white color of good efficiency by using a fluorescent material or mixing colors, and is advantageous in that the light emitting device has power consumption lower than the present light sources, such as a fluorescent light and an incandescent light, a fast response speed, and safety, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY OF THE DISCLOSURE

The present invention is directed to a light emitting device, a light emitting device package, and a lighting device.

The present invention is to provide a light emitting device, a light emitting device package, and a lighting device which have improved electrical and optical characteristics.

The disclosure will be set forth in part in the description which follows and in part will become apparent to those having ordinary skill in the art upon examination of the following or may be learned from practice of the invention. The invention may be realized and attained by the structure particularly pointed out in the written description and claims hereof as well as the appended drawings.

A light emitting device includes a substrate, a light emitting structure including a first conductive semiconductor layer having an exposed region, an active layer, and a second conductive semiconductor layer on the substrate, a first electrode on the exposed region of the first conductive semiconductor layer, and a second electrode on the second conductive semiconductor layer, wherein a side of the light emitting structure has a first sloped side sloped from a reference plane, the first sloped side has a concave-convex structure in which a first direction length is greater than a second direction length, the reference plane is a plane perpendicular to a direction in which the substrate faces the light emitting structure, and the first direction is a sloped direction of the first sloped side and the second direction is a lateral direction of surfaces of the first sloped side. The light emitting device can further include a conductive layer on the second conductive semiconductor layer, and the second electrode can be arranged on the conductive layer.

The first sloped side can include sides of each of the first conductive semiconductor layer, the active layer, and the second conductive semiconductor layer. And, the first sloped side can include sides of the first conductive semiconductor layer. The first sloped side can be sloped at an angle of 5°~85° from the reference plane.

The light emitting structure can include a region of the first conductive semiconductor layer exposed as the second conductive semiconductor layer, the active layer, and a portion of the first conductive semiconductor layer are mesa etched, and the first sloped side includes a side of a first portion of the first conductive semiconductor layer positioned between an upper surface of the first conductive semiconductor layer exposed by the mesa etching and the substrate.

The concave-convex structure can include projected portions and recessed portions, and each of the projected portions and recessed portions can have the first direction length greater than the second direction length. And, a sectional shape of each of the projected portion and the recessed portion in the second direction can include a variety of shapes, such as a polygon, like a square, a rectangle, and a triangle, or a curved shape, like a circle, and ellipse, or a pointed shape.

The substrate can have a second sloped side sloped from the reference plane. The second sloped side can have a concave-convex structure in which the first direction length is greater than the second direction length. The second sloped side is in contact with the first sloped side which matches to the second slope side, and provided on the same sloped plane. The concave-convex structures of the first sloped side and the second sloped side which matches to the first sloped side can be in contact with each other and have identical profiles. The second sloped side can be sloped at an angle of 5°~85° from the reference plane. The first sloped side and the second sloped side can have sloped angles from the reference plane the same with each other. The first sloped side and the second sloped side can have sloped angles from the reference plane different from each other.

The side of the mesa structure formed on the first portion by the mesa etching can be vertical, wherein the mesa structure can include a second portion of the first conductive semiconductor layer, the active layer, and the second conductive semiconductor layer, and the second portion can be a remained portion of the first conductive semiconductor layer positioned on the first portion.

A line which connects the first sloped side to the second sloped side is sloped at 5°~85° from the reference plane. The light emitting structure can have a cross sectional area which becomes the greater as the light emitting structure goes from the second conductive semiconductor layer to the first conductive semiconductor layer the more.

A light emitting device package includes a package body, a light emitting device on the package body, a first electrode layer and a second electrode layer provided on the package body connected to the light emitting device, and a filling material which encloses the light emitting device, wherein the light emitting device can be a light emitting device in accordance with one of the preferred embodiments of the present invention.

A lighting device includes a light source having a plurality of light emitting device packages on a substrate for emitting a light, a housing for housing the light source, a heat dissipating unit for dissipating heat from the light source, and a holder for fastening the light source and the heat dissipating unit to the housing, wherein the light emitting device package can be a light emitting device package in accordance with one of the preferred embodiments of the present invention.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
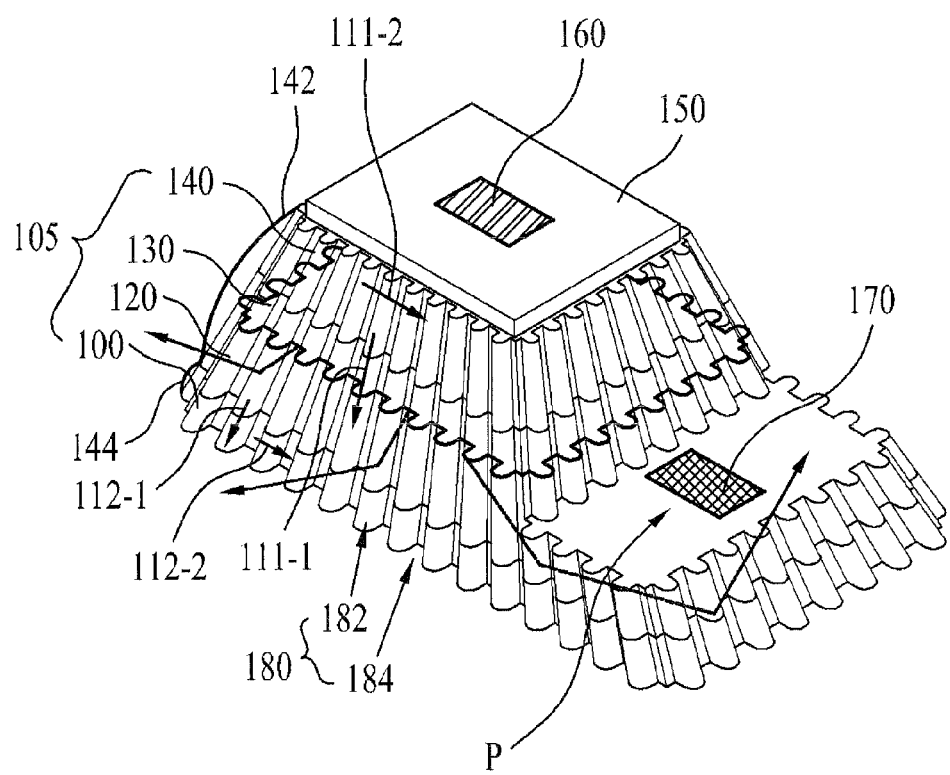
FIG. 1 illustrates a perspective view of a light emitting device in accordance with a preferred embodiment of the present invention.

Reference will now be made in detail to the specific embodiments of the present invention, examples of which are illustrated in the accompanying drawings. Wherever possible, the same reference numbers will be used throughout the drawings to refer to the same or like parts.

It is required to understand that, description of embodiments that a layer (a film), a region, a pattern, or a structure is formed "on" or "under" a substrate, a layer (a film), a region, a pad, or pattern, the "on", or "under" implies that the layer (the film), the region, the pattern, or the structure is formed "on" or "under" the substrate, the layer (the film), the region, the pad, or the pattern directly or indirectly. And, a reference on the "on" or "under" is the drawing.

A thickness or a size of a layer shown in a drawing is exaggerated, omitted or shown schematically for convenience or clarity of description. And, a size of an element is not shown to scale, perfectly.

FIG. 1 illustrates a perspective view of a light emitting device in accordance with a preferred embodiment of the present invention. As shown in FIG. 1, the light emitting device includes a substrate 100, a light emitting structure 105 on the substrate 100, a conductive layer 150, a first electrode 170, and a second electrode 160.

The light emitting structure 105 includes a first conductive type semiconductor layer 120, an active layer 130, and a second conductive type semiconductor layer 140. For an example, the light emitting structure 105 can be a structure in which the first conductive type semiconductor layer 120, the active layer 130, and the second conductive type semiconductor layer 140 are stacked on the substrate 100 in succession. Though the light emitting structure 105 can be formed of a nitride semiconductor, the material of the light emitting structure 105 is not limited to this, but can be formed of other material.

The substrate 100 supports the light emitting structure 105 and can be any one of a sapphire substrate, a silicon Si substrate, zinc oxide ZnO substrate, and a nitride semiconductor substrate or a template substrate having at least one of GaN, InGaN, AlInGaN, SiC, GaP, InP, $Ga_2O_3$, and GaAs stacked thereon.

The first semiconductor layer 120 is arranged on the substrate 100. The first semiconductor layer 120 can be constructed only of a first conductive type semiconductor layer or the first conductive type semiconductor layer and an undoped semiconductor layer under the first conductive type semiconductor layer. However, construction of the first semiconductor layer 120 is not limited to this. The undoped semiconductor layer, formed for improving crystallinity of the first conductive type semiconductor layer, can be identical to the first conductive type semiconductor layer except the undoped semiconductor layer has electric conductivity lower than the first conductive type semiconductor layer since the undoped semiconductor has no n type dopant doped therein.

For an example, there can be at least one layer or pattern of a compound semiconductor of second to sixth group element, for an example, at least one of a ZnO layer, a buffer layer (not shown), and an undoped semiconductor layer (not shown) formed between the substrate 100 and the light emitting structure 105. The buffer layer or the undoped semiconductor layer can be formed of a compound semiconductor of third to fifth group elements, wherein the buffer layer reduces a lattice constant difference from the substrate 100, and the undoped semiconductor layer can be formed of undoped GaN group semiconductor.

The first conductive type semiconductor layer 120 can include, for an example, an n type semiconductor layer selected from a semiconductor material having composition of $In_xAl_yGa_{1-x-y}N$ ($0 \leq y \leq 1$, $0 \leq y \leq 1$), for an example, GaN, AlN, AlGaN, InGaN, InN, InAlGaN, AlInN, and can be doped with an n type dopant, such as Si, Ge, Sn, Se, Te.

The active layer 130 is arranged on the first semiconductor layer 120. The active layer 130 can include, for an example, a semiconductor material having composition of $In_xAl_yGa_{1-x-y}N$ ($0 \leq x \leq 1$, $0 \leq y \leq 1$), and can include at least one selected from a quantum wire structure, a quantum dot structure, a single quantum well structure, and a multi quantum well structure MQW.

The active layer 130 can emit a light with energy generated in a process of recombination of an electron and a hole provided from the first semiconductor layer 120 and the second conductive type semiconductor layer 140. The active layer 130 is a layer that can emit a light of different wavelengths, and the present invention does not limit a range of wavelengths the active layer 130 can emit.

The second conductive type semiconductor layer 140 is arranged on the active layer 130. The second conductive type semiconductor layer 140 can be, for an example, a p type semiconductor layer selected from a semiconductor material having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, AlInN, and can be doped with a p type dopant, such as Mg, Zn, Ca, Sr, Ba.

The first conductive type semiconductor layer 120 can include the p type semiconductor layer, and the second conductive type semiconductor layer 140 can include the n type semiconductor layer. And, a third conductive type semiconductor layer (not shown) including an n type or a p type semiconductor layer can be formed on the first semiconductor layer 120, enabling the light emitting device of the embodiment to have at least one of np, pn, npn, and pnp junction structure. A doping concentration of a conductive type dopant in the first conductive type semiconductor layer 120 and the second conductive type semiconductor layer 140 may or may not be uniform. That is, the plurality of the semiconductor layers can have a variety of structures, and the present invention does not limit the structures.

The light emitting structure 105 can be a structure in which the second conductive type semiconductor layer 140, the active layer 130 and a portion of the first conductive type semiconductor layer 120 are mesa etched to expose a region P of the first conductive type semiconductor layer 120.

At least one of the substrate 100 and the light emitting structure 105 has a sloped side 142 or 144 sloped at a predetermined angle from a reference plane. The reference plane can be a bottom surface of the substrate 100 or a horizontal plane of the light emitting structure 105 which is vertical to a direction in which the substrate 100 faces the light emitting structure 105.

For an example, in the light emitting device shown in FIG. 1, the substrate 100 and the light emitting structure 105 have the sloped sides 142 and 144 sloped at predetermined angles with reference to the reference plane, respectively.

The light emitting structure 105 can have the first sloped side 142 sloped at a first angle from the reference plane, and the substrate 100 can have the second sloped side 144 sloped at a second angle from the reference plane. For an example, the first angle and the second angle can be 5°~85°, can be the same, or different from each other. The first sloped side 142 and the second sloped side 144 matched to the first sloped side 142 can be in contact with or connected to each other on the same sloped plane. As shown in FIG. 1, since the light emitting device has the light emitting structure 105 with the first sloped side 142 and the substrate 100 with the second sloped side 144, the light emitting structure 105 can have a cross sectional area which increases gradually as the light emitting structure 105 goes from the second conductive type semiconductor layer 140 to the substrate 100 the more. Such a shape can be obtained by etching to be described later.

For an example, a line that connects the first sloped side 142 of the light emitting structure 105 to the second sloped side 144 of the substrate 100 forms the angle of 5°~85° from the reference plane and is not parallel to the reference plane.

And, edge portions of the substrate 100, the first conductive type semiconductor layer 120, the active layer 130, and the second conductive type semiconductor layer 140 are patterned round. This is because edges of the mask used in the etching are patterned round, as described later. And, depending on a shape of the mask described later, a concave-convex pattern 180, such as a polygonal shape, or a pointed shape, can be formed at sides of the substrate 100, the first conductive type semiconductor layer 120, the active layer 130, and the second conductive type semiconductor layer 140, respectively.

At least one of the first sloped side 142 of the light emitting structure 105, and the second sloped side 144 of the substrate 100 has the concave-convex pattern. The concave-convex pattern can have a concave-convex structure in which a sloped direction length is greater than a lateral direction length of the slope side.

For an example, the concave-convex pattern of the first sloped side 142 can have the concave-convex structure in which the first direction length is greater than the second direction length, and the concave-convex pattern of the second sloped side 144 can have the concave-convex structure in which the third direction length is greater than the fourth direction length.

The first direction can be a sloped direction 111-1 of the first sloped side 142, and the second direction can be a lateral direction 111-2 of the first sloped side 142. And, the third direction can be a sloped direction 111-2 of the second sloped side 144, and the fourth direction can be a lateral direction 112-2 of the second sloped side 144. The sloped direction 111-1 or 112-1 can be perpendicular to the lateral direction 111-2 or 112-2. The concave-convex pattern on the first sloped side 142 can be in contact with the concave-convex pattern on the second sloped side 144 which is matched to the first sloped side 142, and can have identical profiles. For example, the concave pattern on the first sloped side 142 can be matched to the concave pattern on the second sloped side 144, and the convex pattern on the first sloped side 142 can be matched to the convex pattern on the second sloped side 144.

In detail, the concave-convex pattern 180 has projected portions 182 and recessed portions 184, and the projected portion 182 and the recessed portion 184 can be a concave-convex structure in which the first direction length is greater than the second direction length. Sectional shapes of the projected portion 182 and the recessed portion 184 in the second direction can have a variety of shapes, such as a polygon, like a square, a rectangle, and a triangle, or a curved shape, like a circle, and ellipse, or a pointed shape.

The conductive layer 150 is arranged on the second conductive type semiconductor layer 140. Since the conductive layer 150 not only reduces total reflection, but also has good light transmissivity, the conductive layer 150 increases extraction efficiency of the light emitted from the active layer 130 to the second conductive type semiconductor layer 140. The conductive layer 150 can be formed of a transparent oxide group material having high transmissivity on a wavelength of a light. For an example, the transparent oxide group material can be ITO (Indium Tin Oxide), TO (Tin Oxide), IZO (Indium Zinc Oxide), and ZnO (Zinc Oxide).

The first electrode 170 can be arranged on a region P of the first conductive type semiconductor layer 120 exposed as the light emitting structure 105 is mesa etched, and the second electrode 160 can be arranged on the conductive layer 150 on the second conductive type semiconductor layer 140. The first electrode 170 and the second electrode 160 can be a single layer or a multi-layer of a material or an alloy including at least one selected from Ti, Al, an Al alloy, In, Ta, Pd, Co, Ni, Si, Ge, Ag, an Ag alloy, Au, Hf, Pt, Ru, and Au.

Upon application of a current to the light emitting device in accordance with a preferred embodiment of the present invention in FIG. 1, to supply the current to the first electrode 170 and the second electrode 160, a hole + is discharged from the second conductive type semiconductor layer 140 to the active layer 130, and an electron − is discharged from the first conductive type semiconductor layer 120 to the active layer 130. A light can be generated by an energy level to generate energy in a mode of a light as the energy created in a process of recombination of an electron and a hole. As shown with arrows in FIG. 1, the light traveling downward can be reflected at boundaries of the layers in the light emitting structure 105 or a boundary surface of the sapphire substrate 100, and travels toward a front of the light emitting device.

In general, since a defect density of a nitride semiconductor single crystal which forms a light emitting structure is very high owing to stress caused by lattice mismatch with a hetero-substrate, causing poor electric and optical characteristics of the light emitting device. And, the rectangular structure of the light emitting structure makes weak optical extraction since loss of a photon emitted within a critical angle takes place in the light emitting structure.

However, the light emitting device of the embodiment is formed such that the substrate 100 and the light emitting structure 105 have sloped sides 142 and 144 respectively, each sloped at 5°~85° from the reference plane. According to this, the light emitting device can reflect more light toward the front of the light emitting device at the sloped sides 143 and 144. And, the concave-convex pattern 180 provided at the sloped sides 143 and 144 changes a refraction angle of the light to increase optical extraction efficiency. Particularly, by providing the concave-convex pattern 180 having the concave-convex structure in which the first direction length is greater than the second direction length at the sides of the first conductive type semiconductor layer 120, the active layer 130, and the second conductive type semiconductor layer 140 of the light emitting structure 105, the optical extraction efficiency can be enhanced owing to the change of the light refraction angle.

Figure 2A:
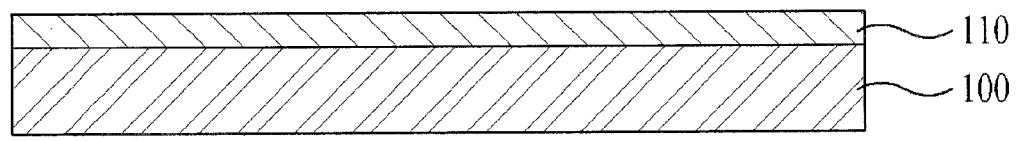
FIGS. 2A~2G illustrate schematic views showing the steps of a method for fabricating the light emitting device in FIG. 1.

FIGS. 2A~2G illustrate schematic views showing the steps of a method for fabricating the light emitting device in FIG. 1. As shown in FIG. 2A, a buffer layer 110 is formed on a sapphire substrate 100. A substrate 100 can be formed of sapphire $Al_2O_3$, GaN, SiC, ZnO, Si, GaP, InP, $Ga_2O_3$, and GaAs. And, the buffer layer 110 can be grown of a low temperature grown GaN layer, or AlN layer for moderating the lattice mismatch and a difference of thermal expansion coefficients between the substrate 100 and the nitride semiconductor layer to be grown later.

Figure 2B:
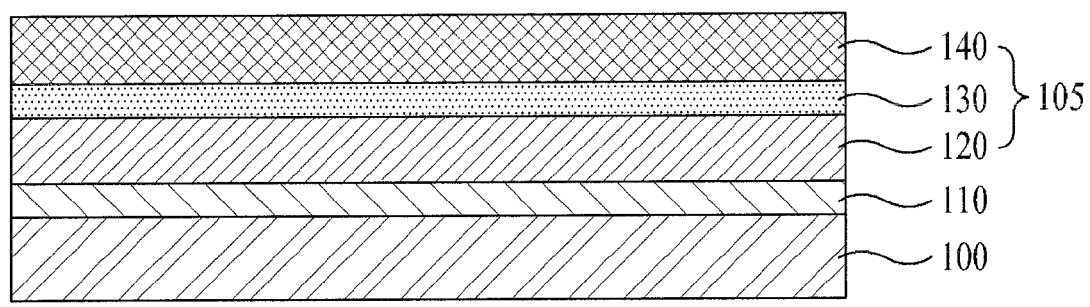

And, referring to FIG. 2B, a light emitting structure 105 of the nitride semiconductor is stacked on the buffer layer 110. The light emitting structure 105 can include a first conductive type semiconductor layer 120, an active layer 130, and a second conductive type semiconductor layer 140.

The light emitting structure 105 can be formed by Metal Organic Chemical Vapor Deposition MOCVD, Chemical Vapor Deposition CVD, Plasma-Enhanced Chemical Vapor Deposition PECVD, Molecular Beam Epitaxy MBE, or Hydride Vapor Phase Epitaxy HVPE, but methods for forming the light emitting structure 105 are not limited to above.

The first conductive type semiconductor layer 120 can include, for an example, an n type semiconductor layer selected from a semiconductor material having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, AlInN, and can be doped with n type dopant, such as Si, Ge, Sn, Se, Te.

The active layer 130 is grown on the first semiconductor layer 120. The active layer 130 has a single or a multi-quantum well MQW structure, and can include a quantum wire structure, or a quantum dot structure.

The active layer 130 can include a well layer and a barrier layer of a compound semiconductor material of third to fifth group elements having at least one period, such as InGaN well layer/GaN barrier layer, InGaN well layer/AlGaN barrier layer, and InGaN well layer/InGaN barrier layer. A conductive type clad layer can be formed of GaN group semiconductor on or/and an underside of the active layer 130.

Then, the second conductive type semiconductor layer 140 is grown on the active layer 130. The second conductive type semiconductor layer 140 can include a nitride semiconductor material having composition of $In_xAl_yGa_{1-x-y}N$ ($0 \leq x \leq 1$, $0 \leq y \leq 1$, $0 \leq x+y \leq 1$) doped with p type dopant, such as Mg, Zn, Ca, Sr, or Ba.

Figure 2C:
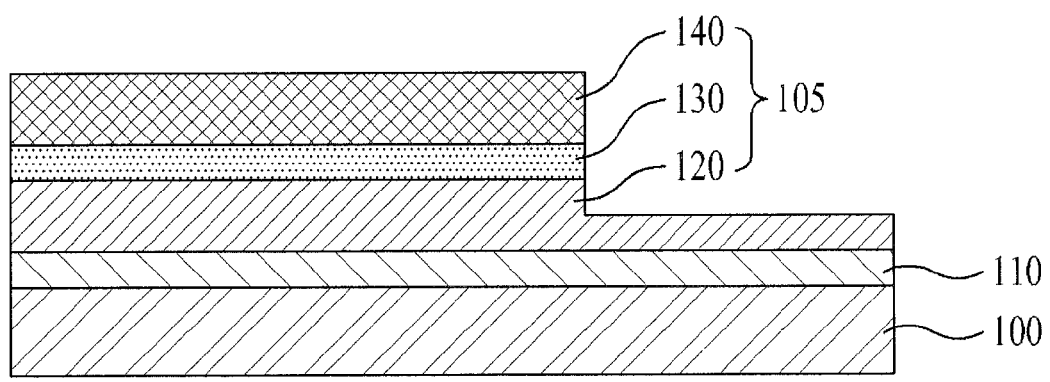

Then, referring to FIG. 2C, Mesa etching is performed from the second conductive type semiconductor layer 140 to a portion of the first conductive type semiconductor layer 120 by RIE (Reactive Ion Etching).

That is, since an electrode can not be formed under an insulating substrate, such as the sapphire substrate, Mesa etching is performed from the second conductive type semiconductor layer 140 to a portion of the first conductive type semiconductor layer 120 for securing a space for forming a first electrode.

Figure 2D:
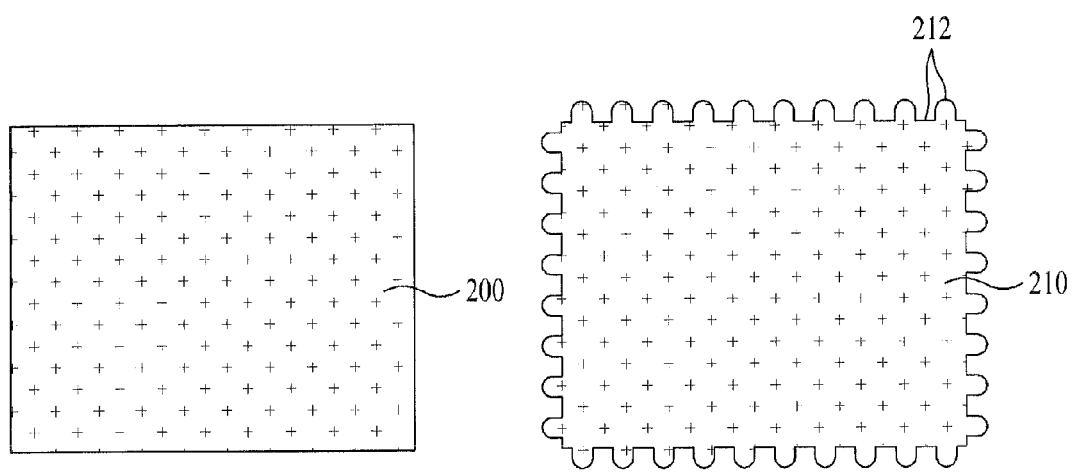

Then, referring to FIG. 2D, masks 200 and 210 are provided. The masks 200 and 210 can be used for etching the substrate 100, the buffer layer 110, and the nitride semiconductor.

If it is intended to form a light emitting device having nitride semiconductor vertically grown from the substrate, by forming a photoresist pattern which defines unit light emitting device of a desired size on the nitride semiconductor, and performing vertical dry etching or the like by using the photoresist pattern as an etch mask, the unit light emitting device can be separated.

However, since the embodiment requires tilted etching down to the nitride semiconductor and the substrate 100, it is also required to take spacing between the light emitting devices after removal of the mask into account at the time the mask 200 or 210 is placed. That is, sizes of the masks 200 and 210 can be the same or smaller than the second conductive type semiconductor layer 140 mesa etched thus. And, the mask 210 is also positioned on a first conductive type semiconductor layer 120 region exposed by the mesa etching.

And, the masks 200 and 210 can be formed of silicon oxide $SiO_x$, or silicon nitride $SiN_x$, or transparent conductive oxide TCO taking electric and optical characteristics into account.

And, though the first mask 200 has a square shape without the concave-convex pattern at sides, the second mask 210 can have a patterned shape 210 or the concave-convex pattern 212 at sides for patterning the sides of the light emitting device.

Figure 2E:
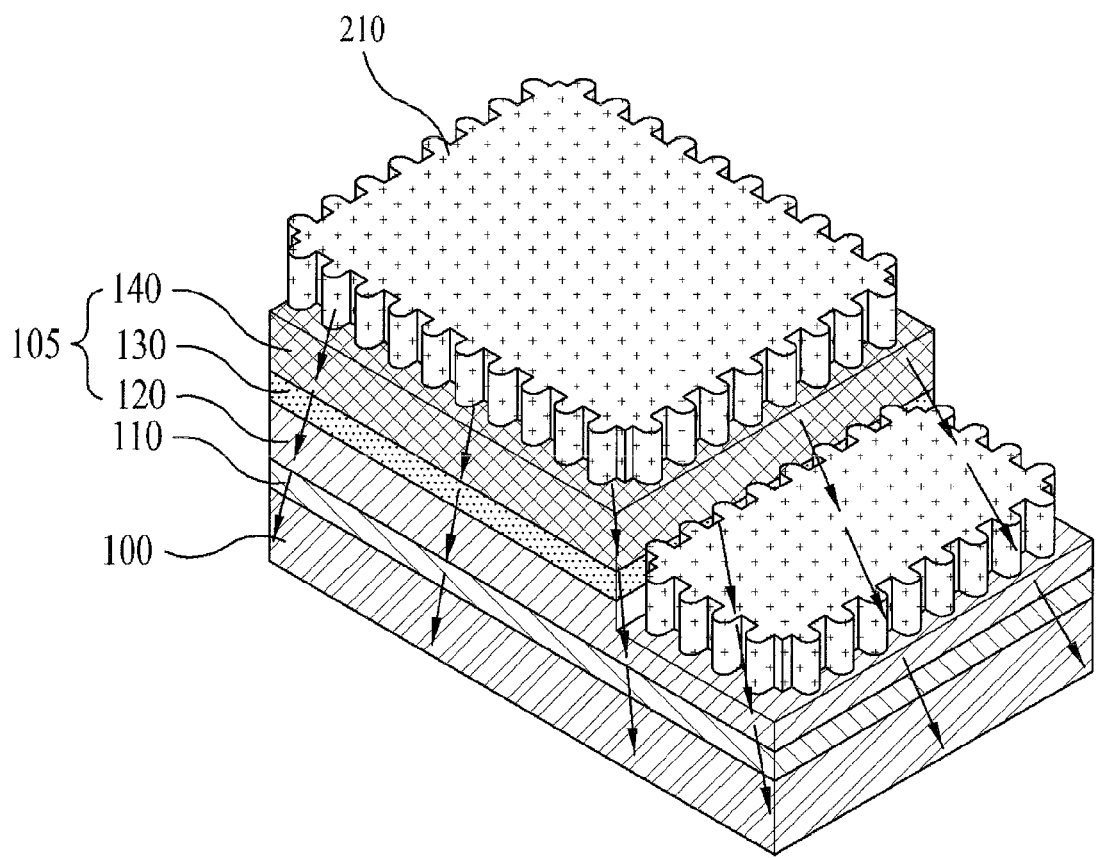
Figure 2F:
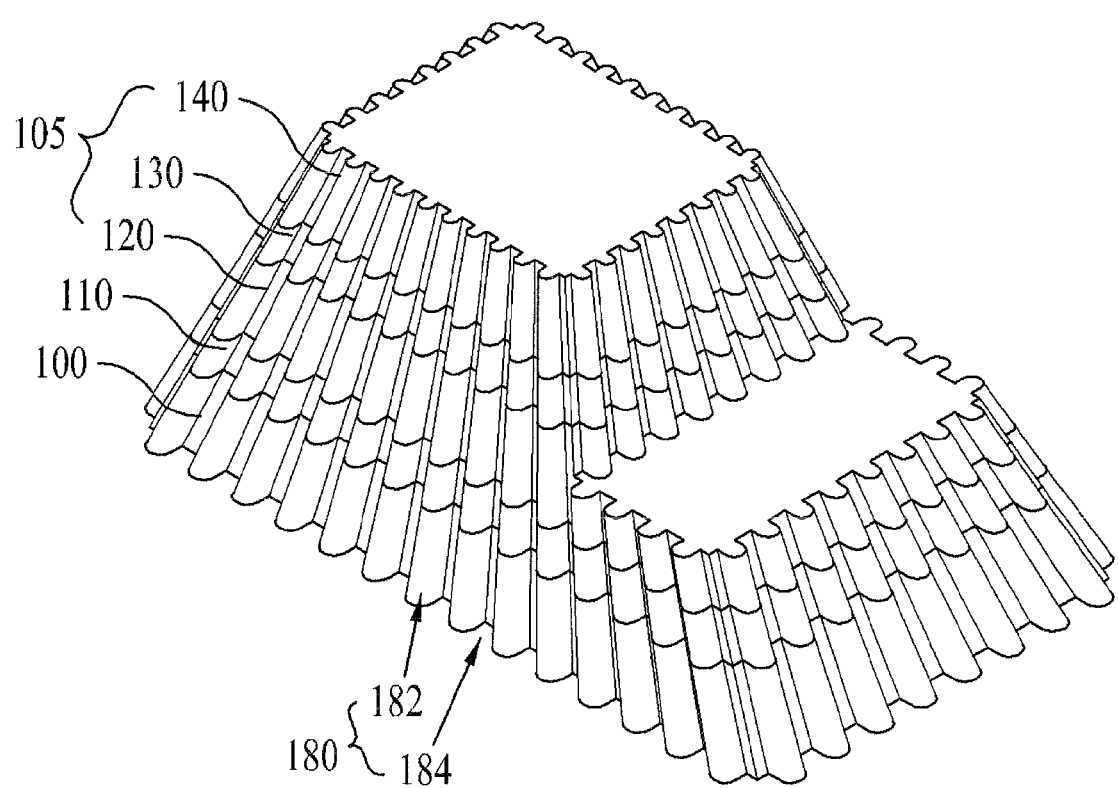

Then, referring to FIGS. 2E and 2F, the second mask 210 is placed on the second conductive type semiconductor layer 140, the second conductive type semiconductor layer 140, the active layer 130, the first conductive type semiconductor layer 120, the buffer layer 110, and the substrate 100 are etched by using the second mask 210 as an etching mask.

Besides etching layers of the light emitting device with a slope, since the etching is required to separate the light emitting devices, an entire substrate 100 is etched.

And, though it is shown that sides of the second mask 210 are patterned to have rounds, the pattern of the second mask 210 is not limited to this, but the sides of the second mask 210 can be patterned to have a variety of concave-convex patterns, such as a polygonal shape, or a pointed shape.

By etching the substrate 100 and the light emitting structure 105 by using the second mask 210, sides of each of the substrate 100 and the light emitting structure 105 can be formed to slope at a predetermined angle from a bottom surface (or a horizontal plane) of the substrate 100, with a concave-convex pattern 180 formed at the sides of each of the substrate 100 and the light emitting structure 105. The concave-convex pattern 180 has a concave-convex structure in which a first direction length is greater than a second direction length. The first direction and the second direction are the same with the description in FIG. 1.

For an example, the concave-convex pattern 180 has projected portions 182 and recessed portions 184, and the projected portion 182 and the recessed portion 184 can be a concave-convex structure in which the first direction length is greater than the second direction length. Sectional shapes of the projected portion 182 and the recessed portion 184 in the second direction can have a variety of shapes, such as a polygon, like a square, a rectangle, and a triangle, or a curved shape, like a circle, and ellipse, or a pointed shape.

And, a line which connects an edge of the sapphire substrate 100 to the light emitting structure 105 forms an angle of 5~85° from the horizontal plane. That is, the line forms an angle smaller than a right angle, and may not be parallel to the horizontal plane.

And, as shown, the etching can be dry etching performed from the p type nitride semiconductor layer 140 to the substrate 100 in succession with a slope. And, a portion removed in the mesa etching in the step shown in FIG. 2C may not be sloped.

After finishing the mesa etching, edge portions of the substrate 100, the buffer layer 110, the first conductive type semiconductor layer 120, the active layer 130, and the second conductive type semiconductor layer 140 are formed and patterned with a slope.

In above etching, by making a size of the masks 200 and 210 greater, only the edge portion of the sapphire substrate 100 can be patterned. This is because, even if the edge of the nitride semiconductor is patterned vertically, and only the edge of the sapphire substrate 100 is patterned in the concave-convex shape, it is possible to expect to enhance the optical extraction efficiency by refracting/reflecting the light traveling to the sapphire substrate 100 from the active layer 130.

Figure 2G:
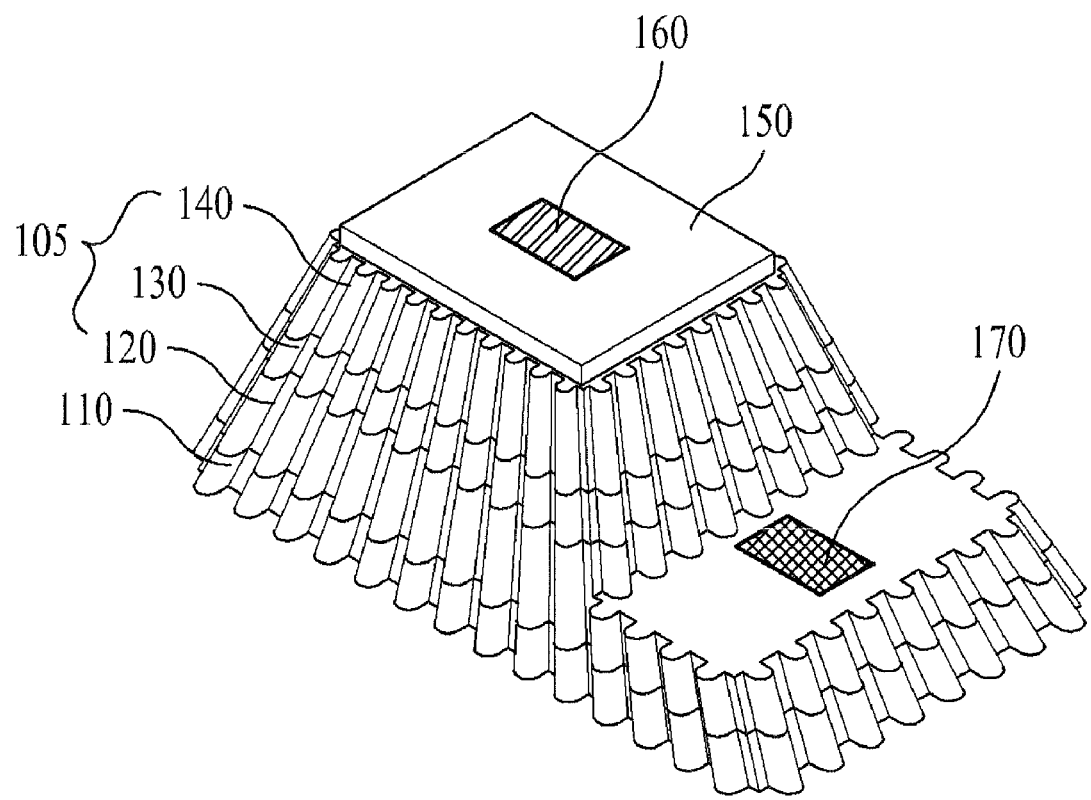

Then, referring to FIG. 2G, a conductive layer 150 is formed on the second conductive type semiconductor layer 140. The conductive layer 150 can be the same with the description made with reference to FIG. 1. Then, a second electrode 160 is formed on the conductive layer 150. The second electrode 160 can formed of one metal selected from chrome Cr, nickel Ni, gold Au, aluminum Al, titanium Ti, platinum Pt, or an alloy of above metals. And, a first electrode 170 is formed on the first conductive type semiconductor layer 120 exposed by the mesa etching. The first electrode 170 can be formed of a material identical to the second electrode 160.

The electrodes 160 and 170 can be formed by deposition or sputtering. And, the electrodes 160 and 170 can be formed before the step of tilted patterning of the sides of the substrate 100 and the light emitting structure 105 described with reference to FIGS. 2E and 2F.

Figure 3:
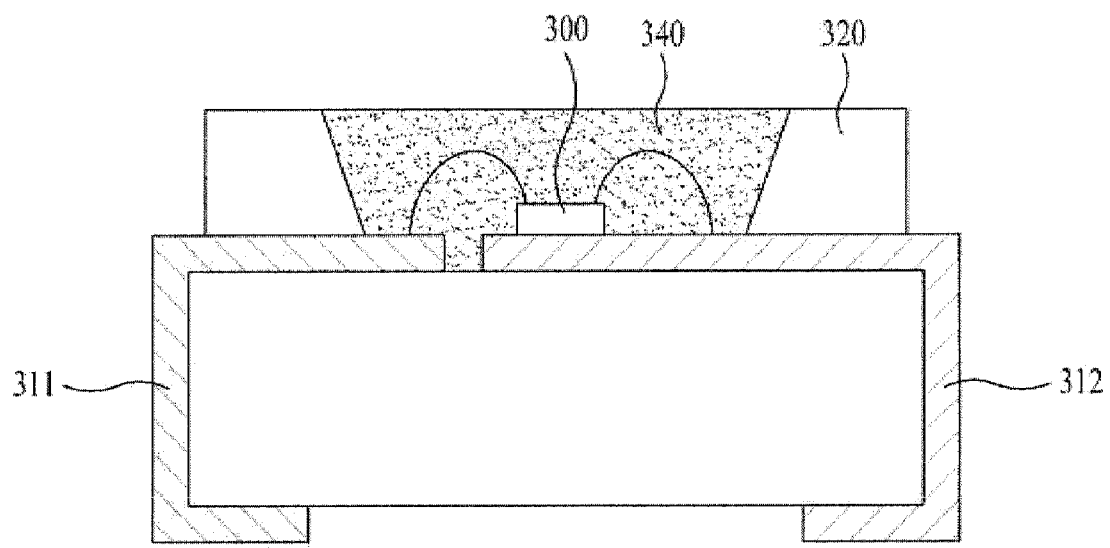
FIG. 3 illustrates a section of a light emitting device package in accordance with a preferred embodiment of the present invention.

FIG. 3 illustrates a section of a light emitting device package in accordance with a preferred embodiment of the present invention. As shown in FIG. 3, the light emitting device package includes a package body 320, a first electrode layer 311 and a second electrode layer 312 mounted to the package body 320, a light emitting device 300 of the embodiment mounted on the package body 320 and connected to the first electrode layer 311 and the second electrode layer 312 electrically, and a filling material 340 for enclosing the light emitting device 300. The light emitting device 300 is identical to the light emitting devices described in foregoing embodiments.

The package body 320 can be formed of silicon, synthetic resin, or metal, and enhance the optical extraction efficiency as there is a sloped surface formed around the light emitting device 300.

The first electrode layer 311 and the second electrode layer 312 are separated from each other electrically, and provide power to the light emitting device 300. And, the first electrode layer 311 and the second electrode layer 312 can increase optical efficiency by reflecting the light from the light emitting device 300, and can dissipate heat from the light emitting device 300 to an outside of the light emitting device package.

The light emitting device 300 can be mounted on the package body 320 or the first electrode layer 311 or the second electrode layer 312.

The light emitting device 300 can be connected to the first electrode layer 311 and the second electrode layer 312 by any one type selected from wire, flip chip, or die bonding.

The filling material 340 can enclose the light emitting device 300 to protect the same. And, the filling material 340 can have a fluorescent material included thereto for changing a wavelength of the light from the light emitting device 300.

The light emitting device package can have at least one or a plurality of the light emitting devices in accordance with embodiments disclosed herein. However, the present invention does not limit a number of the light emitting devices to be mounted to the light emitting device package.

And, an array of the light emitting device packages can be on a substrate, and a light guide plate, a prism sheet, a diffusion sheet, and the like that are optical members can be arranged on a light path of the light emitting device package. The light emitting device package, the substrate, and the optical members can function as a lighting unit. As another embodiment, a display device, an indicating device, or a lighting system can be produced, which includes the semiconductor light emitting device or the light emitting device package described in the foregoing embodiments, and the lighting system can include a lamp or a street light.

Figure 4:
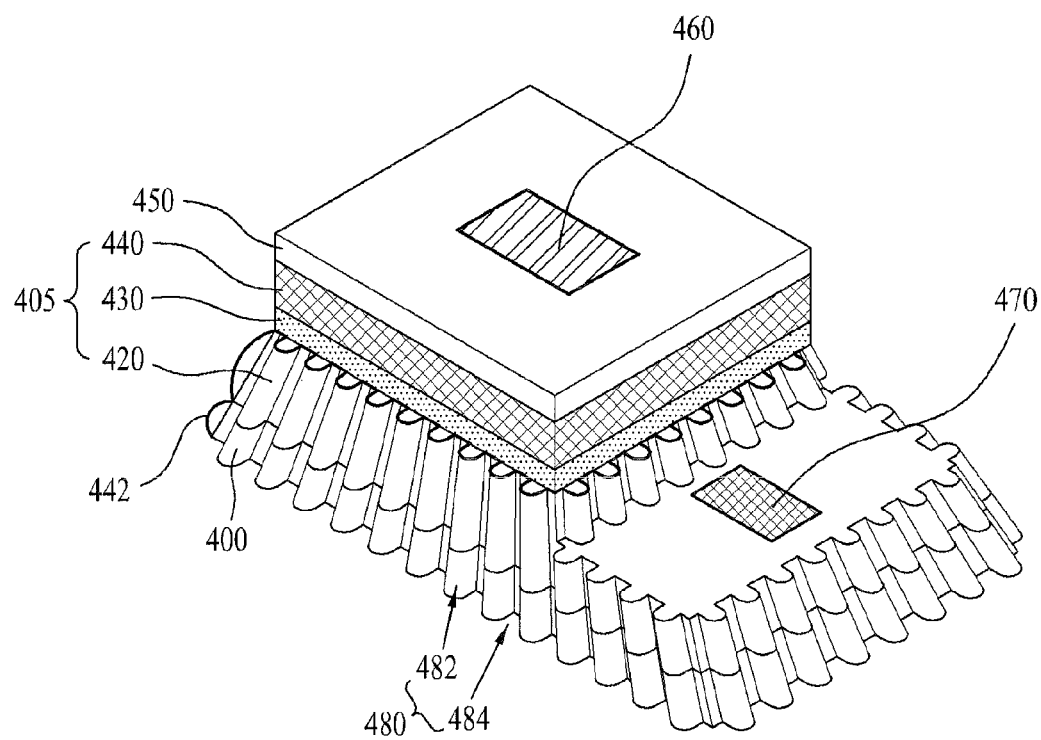
FIG. 4 illustrates a perspective view of a light emitting device in accordance with another preferred embodiment of the present invention.

FIG. 4 illustrates a perspective view of a light emitting device in accordance with another preferred embodiment of the present invention. Edges of the active layer 430 and the second conductive type semiconductor layer 440 shown in FIG. 4 are not patterned.

The light emitting device includes a light emitting structure 405 having a substrate 400, a first conductive type semiconductor layer 420 stacked on the substrate 400, an active layer 430 arranged on the first conductive type semiconductor layer 420, and a second conductive type semiconductor layer 440 arranged on the active layer 430, a conductive layer 450 on the second conductive type semiconductor layer 440, a first electrode 470 on the first conductive type semiconductor layer 420, and a second electrode 460 on the conductive layer 450. Composition or the like of the layers can be identical to the embodiment described with reference to FIG. 1.

The substrate 400 has a first sloped side 442 sloped at a first angle from a bottom surface (or a horizontal plane) of the substrate 400, and the first conductive type semiconductor layer 420 of the light emitting structure 405 has a second sloped side 444 sloped at a second angle from the bottom surface (or the horizontal surface) of the substrate 400. Sides of each of the active layer 430 and the second conductive type semiconductor layer 440 of the light emitting structure 405 can be vertical with reference to the bottom surface (or the horizontal plane) of the substrate 400. The horizontal plane can be a plane perpendicular to a direction the substrate 400 faces the light emitting structure 405.

The first angle and the second angle can be the same, for an example, the first angle and the second angle can be 5°~85°.

And, the first sloped side 442 and the second sloped side 444 can be in contact/connected to each other on the same sloped plane.

Referring to FIG. 4, the light emitting device can have the second sloped side 444 which causes a cross sectional area of the first conductive type semiconductor layer 420 to become the greater as the first conductive type semiconductor layer 420 goes from an upper surface thereof toward the substrate 400 the more.

For an example, a line that connects the first sloped side 442 of the substrate 400 to the second sloped side 444 of the light emitting structure 405 forms the angle of 5°~85° from the bottom surface (or the horizontal surface) of the substrate 400.

The first sloped side of the substrate 400, and the second sloped side of the first conductive type semiconductor layer 420 have concave-convex patterns 480, respectively. In this instance, the concave-convex patterns 480 on the first slope side 442 and the second sloped side 444 have concave-convex structures in which a first direction length is greater than a second direction length, respectively. The first direction and the second direction are identical to above description.

For an example, the concave-convex pattern 180 has projected portions 482 and recessed portions 484, and the projected portion 482 and the recessed portion 484 can be a concave-convex structure in which the first direction length is greater than the second direction length. Sectional shapes of the projected portion 482 and the recessed portion 484 in the second direction can have a variety of shapes, such as a polygon, like a square, a rectangle, and a triangle, or a curved shape, like a circle, and ellipse, or a pointed shape.

Upon application of a current to the light emitting device in accordance with a preferred embodiment of the present invention in FIG. 4, a light can be generated by an energy created in a process of recombination of an electron and a hole. The light traveling downward from the active layer 430 can be reflected at a boundary of the first conductive type semiconductor layer 420 and the substrate 100, to travel toward a front of the light emitting device.

Eventually, the light emitting device of the embodiment can solve problems of the related art light emitting device in which a defect density of a nitride semiconductor single crystal is very high due to stress caused by lattice mismatch with a hetero-substrate to cause electric and optical characteristics of the light emitting device poor, and photons emitted within a critical angle are lost in the light emitting device.

Since the light emitting device of the embodiment is formed such that the substrate 400 and the first conductive type semiconductor layer 420 have sloped sides sloped at 5°~85° from the horizontal plane respectively, the light emitting device can reflect more light toward a front of the light emitting device at the sloped sides, and, the concave-convex pattern 480 at the sloped sides 442 and 444 can change a refraction angle of the light to increase optical extraction efficiency. Particularly, the patterned sides of the substrate 400 and the first conductive type semiconductor layer 420 can increase the optical extraction efficiency owing to the change of the light refraction angle, further.

FIGS. 5A~5G illustrate schematic views showing the steps of a method for fabricating the light emitting device in FIG. 4.

Figure 5A:
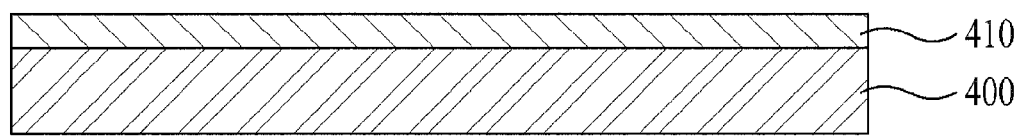
FIGS. 5A~5G illustrate schematic views showing the steps of a method for fabricating the light emitting device in FIG. 4.
Figure 5B:
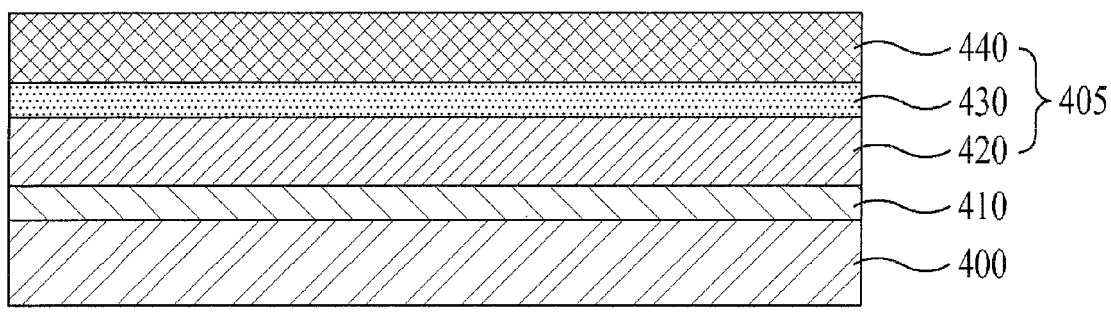
Figure 5C:
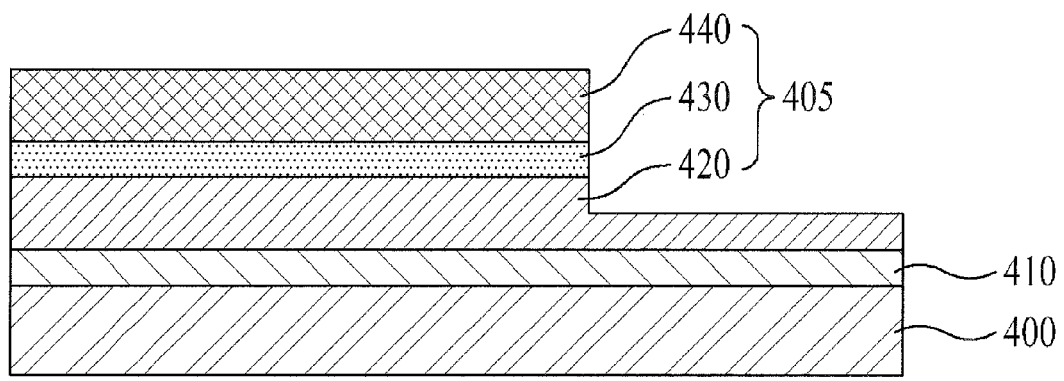
Figure 5D:
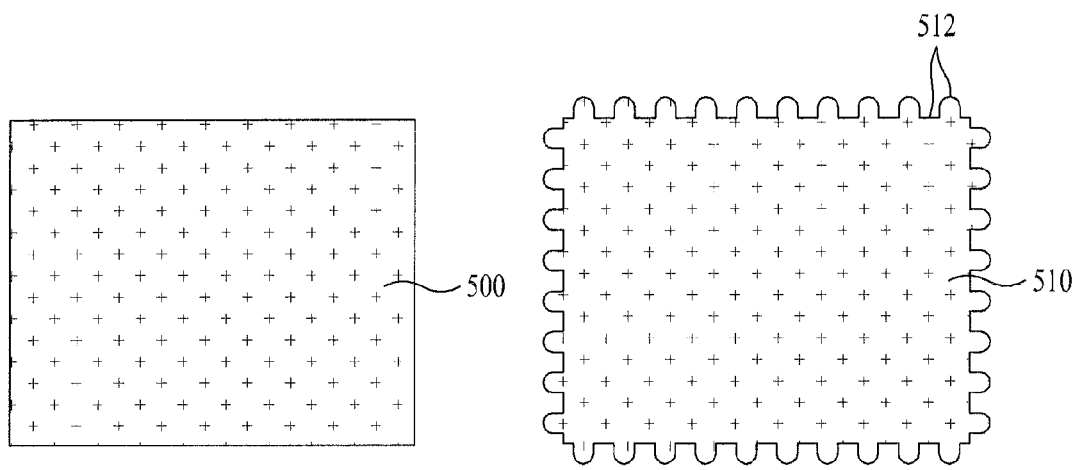

Since the steps illustrated in FIGS. 5A~5C are identical to the description made with reference to FIGS. 2A~2C, description of the steps illustrated in FIGS. 5A~5C will be omitted. And, though shapes of the masks 500 and 510 illustrated in FIG. 5D are identical to the masks illustrated in FIG. 2D, in order not to etch edges of the active layer 430 and the second conductive type semiconductor layer 440, areas of the first mask 500 and the second mask 510 can be greater than areas of the active layer 430 and the second conductive semiconductor layer 440 respectively and smaller than an area of the first conductive type semiconductor layer 420.

Figure 5E:
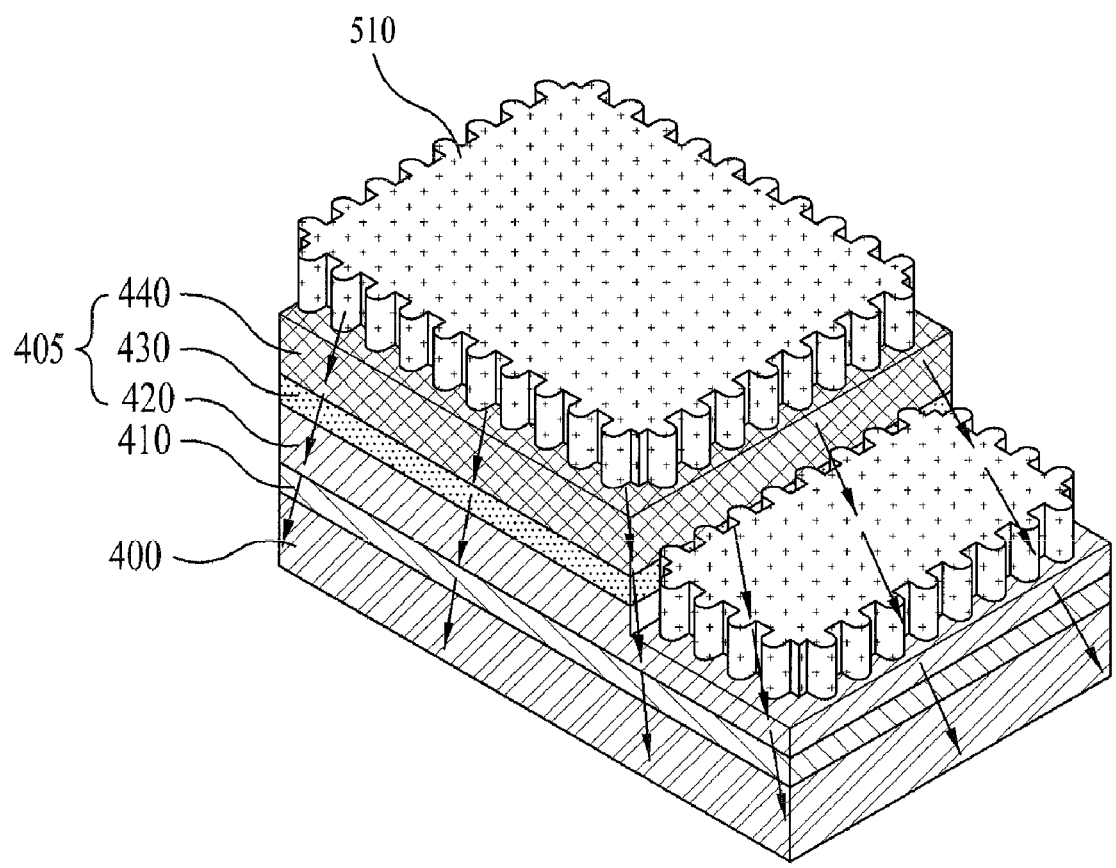
Figure 5F:
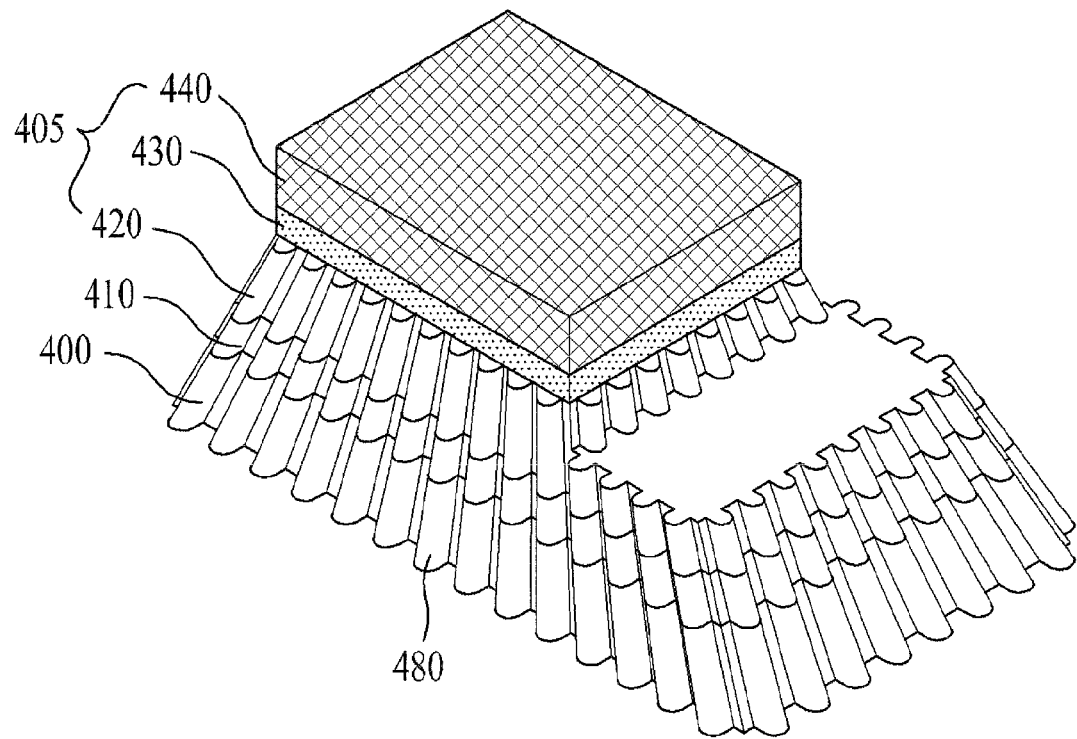

Then, referring to FIGS. 5E and 5F, the second mask 510 is placed on the second conductive type semiconductor layer 440. The second mask 510 can be positioned on a first conductive type semiconductor layer 420 region exposed by mesa etching. The first conductive type semiconductor layer 420 is etched by using the second mask 510. The buffer layer 410 and the substrate 400 can be etched together with the first conductive type semiconductor layer 420.

By etching the substrate 100 and the light emitting structure 405 by using the second mask 510, the side of the first conductive type semiconductor layer 420 and the side of the substrate 400 are formed sloped at an angle (for an example, 5°~85°) from the reference plane, with concave-convex patterns 480 formed on sides of the substrate 400 and the first conductive type semiconductor layer 420. The concave-convex pattern 480 has a concave-convex structure in which a first direction length is greater than a second direction length. The concave-convex pattern 480 illustrated in FIG. 5F is identical to the description made with reference to FIG. 4.

Though edge etching steps of the layers are identical to the description made with reference to FIGS. 2E and 2F, in the embodiment, the second conductive type semiconductor layer 440 and the active layer 430 are not etched owing to a size of the mask 510.

Figure 5G:
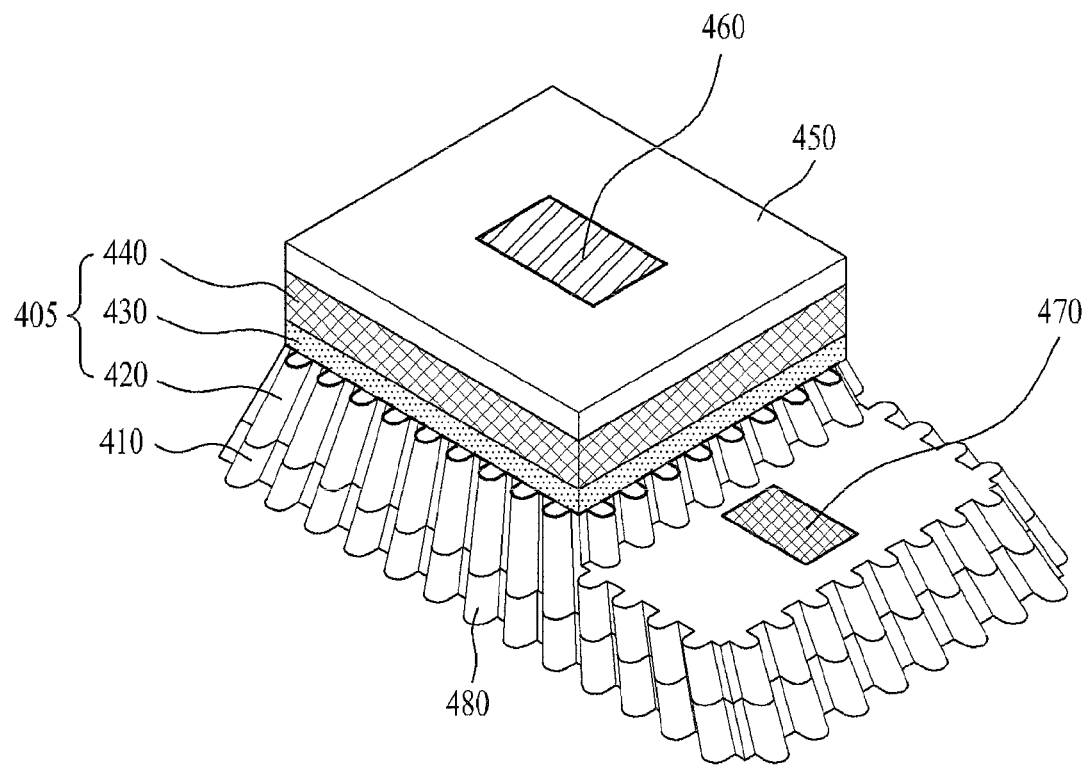

Then, referring to FIG. 5G, a conductive layer 450 is formed on the second conductive type semiconductor layer 440. Then, a second electrode 460 is formed on the conductive layer 450, and a first electrode 470 is formed on the first conductive type semiconductor layer 420 exposed by mesa etching. A material and a forming method of the electrodes 460 and 470 are identical to above embodiment.

Figure 6:
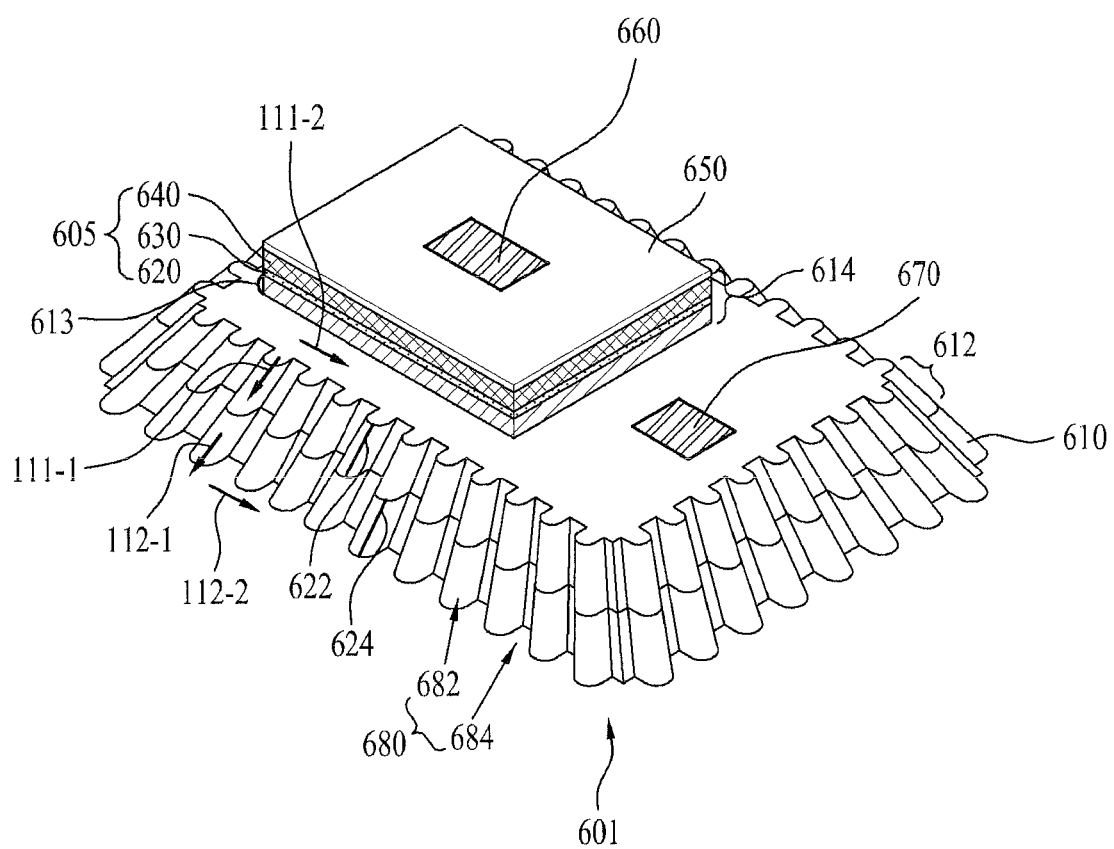
FIG. 6 illustrates a perspective view of a light emitting device in accordance with another preferred embodiment of the present invention.

FIG. 6 illustrates a perspective view of a light emitting device in accordance with another preferred embodiment of the present invention. As shown in FIG. 6, the light emitting device includes a substrate 610, a light emitting structure 605, a conductive layer 650, a first electrode 660, and a second electrode 670.

The light emitting structure 605 is arranged on the substrate 610, and includes a first conductive type semiconductor layer 620, an active layer 630, and second conductive type semiconductor layer 640. The light emitting structure 605 exposes a region of the first conductive type semiconductor layer 620 as the second conductive type semiconductor layer 640, the active layer 630, and a portion of the first conductive type semiconductor layer 620 are mesa etched.

The substrate 610 and a first portion 612 of the first conductive type semiconductor layer 620 have sloped sides sloped an angle θ from the reference plane 601, respectively.

For an example, the first portion 612 of the first conductive type semiconductor layer 620 has a first sloped side 622 sloped at a first angle (for an example, 5°~85°) from the reference plane 601. The first portion 612 of the first conductive type semiconductor layer 620 is a portion of the first conductive type semiconductor layer 620 positioned between an upper surface of the first conductive type semiconductor layer 620 exposed by mesa etching and the substrate 610.

And, the substrate 610 has a second sloped side 624 sloped at a second angle (for an example, 5°~85°) from the reference plane 601. The reference plane 601 can be a bottom surface of the substrate 610 or a horizontal surface of the light emitting structure 605 perpendicular to a direction in which the substrate faces the light emitting structure 605. And, the first angle and the second angle can be 5°~85°, and may or may not be the same. The first sloped side 622 and the second sloped side 624 can be in contact with each other and positioned on the same sloped plane.

Though sides of a mesa structure 614 formed by mesa etching can be vertical, the sides of the mesa structure 614 is not limited to this, but can be sloped surfaces having slopes from the reference plane 601. The mesa structure 614 includes a second portion 613 of the first conductive type semiconductor layer 620, the active layer 630, and the second conductive type semiconductor layer 640. The second portion 613 of the first conductive type semiconductor layer 620 is the rest of the first conductive type semiconductor layer 620 positioned on the first portion 612.

The first sloped side 622 and the second sloped side 624 have the concave-convex patterns 680, respectively. The concave-convex pattern 680 can be formed at least one of surfaces of the first sloped side 622 and the second slope side 624 and can be a concave-convex structure in which a sloped direction length is greater than a lateral direction length of the sloped side.

For an example, the concave-convex pattern of the first sloped side 622 can have the concave-convex structure in which the first direction length is greater than the second direction length, and the concave-convex pattern of the second sloped side 624 can have the concave-convex structure in which the third direction length is greater than the fourth direction length. The first direction can be a sloped direction 111-1 of the first sloped side 622, and the second direction can be a lateral direction 111-2 of the first sloped side 622. And, the third direction can be a sloped direction 112-1 of the second sloped side 624, and the fourth direction can be a lateral direction 112-2 of the second sloped side 624. The sloped direction 111-1 or 112-1 can be perpendicular to the lateral direction 111-2 or 112-2. The concave-convex pattern on the first sloped side 622 can be in contact with the concave-convex pattern on the second sloped side 624 which is matched to the first sloped side 622, and can have identical profiles.

In detail, the concave-convex pattern 680 has projected portions 682 and recessed portions 684, and the projected portion 682 and the recessed portion 684 can be concave-convex structure in which a sloped direction length is greater than a lateral direction length. Sectional shapes of the projected portion 682 and the recessed portion 684 in the second direction can have a variety of shapes, such as a polygon, like a square, a rectangle, and a triangle, or a curved shape, like a circle, and ellipse, or a pointed shape.

The light emitting device of the embodiment can enhance the optical extraction efficiency, because sides of the substrate 610 and the first portion 612 of the first conductive type semiconductor layer 612 are sloped at 5°~85° from the reference plane 601 respectively, enabling to reflect more light toward a front the light emitting device as the sloped sides 442 and 444 can reflect more light toward the front, and the concave-convex patterns 680 provided at the sloped sides 642 and 644 change a refraction angle of the light.

Figure 7A:
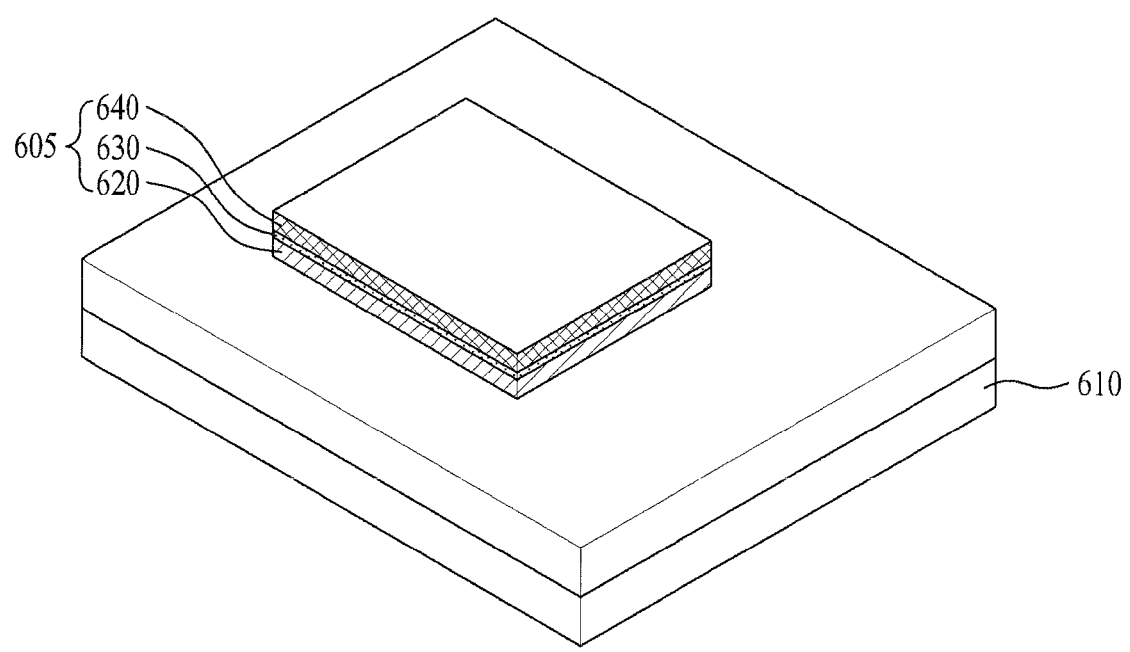
FIGS. 7A~7C illustrate perspective views showing the steps of a method for fabricating the light emitting device in FIG. 6.
Figure 7B:
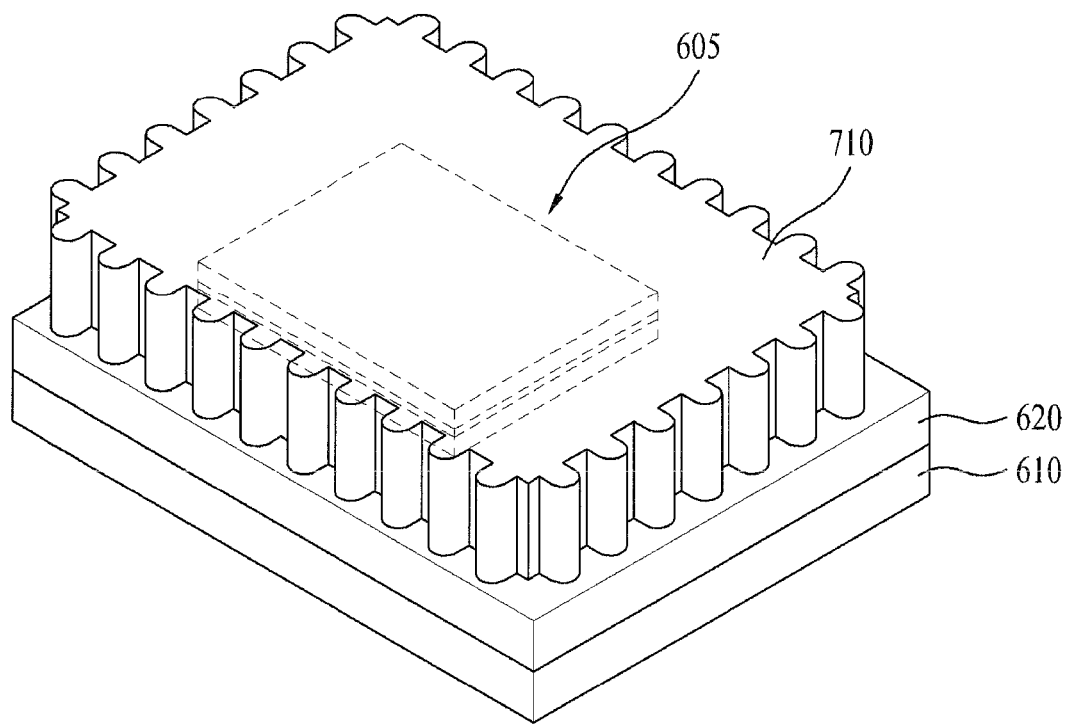
Figure 7C:
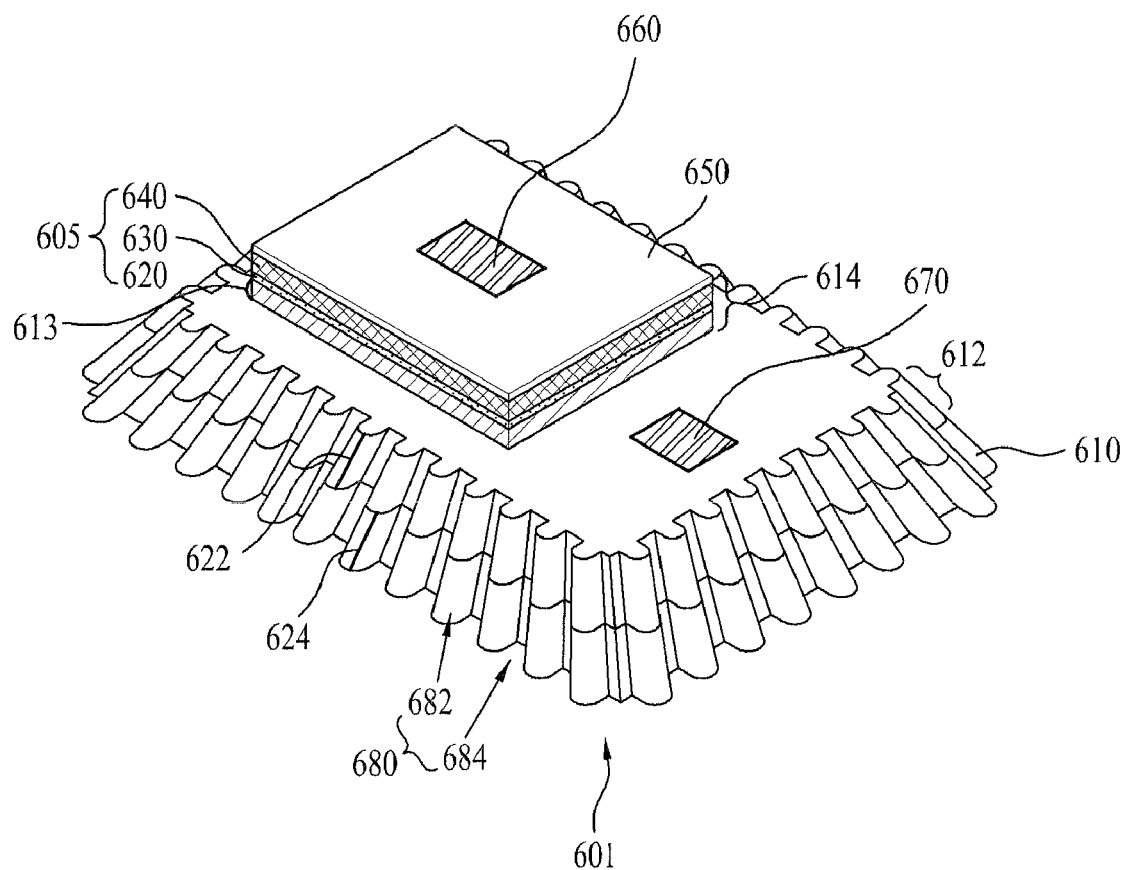

FIGS. 7A~7C illustrate perspective views showing the steps of a method for fabricating the light emitting device in FIG. 6.

Referring to FIG. 7A, a light emitting structure 605 is formed on a sapphire substrate 610, which includes a first conductive type semiconductor layer 620, an active layer 630, a second conductive type semiconductor layer 640, and exposes a region of the first conductive type semiconductor layer 620. In order to reduce a lattice constant difference, a buffer layer (not shown) may be formed between the substrate 610 and the first conductive type semiconductor layer 620.

For an example, the first conductive type semiconductor layer 620, the active layer 630, and the second conductive type semiconductor layer 640 are formed on the substrate 610 in succession. Then, mesa etching is performed from the second conductive type semiconductor layer 640 to a portion of the first conductive type semiconductor layer 620 by RIE (Reactive Ion Etching), to expose the portion of the first conductive type semiconductor layer 620.

Then, referring to FIG. 7B, a mask 710 is placed on the light emitting structure 605, and an edge portion of the first conductive type semiconductor layer 620 exposed by the mesa etching and underlying substrate 610 are etched by using the mask 710 as an etch mask.

A shape of the mask 710 can be determined taking a shape of the light emitting devices to be separated into account. For an example, the mask 710 can be square, and can have a concave-convex pattern at a side thereof.

The exposed edge portion of the first conductive type semiconductor layer 620 and underlying substrate 100 are etched by using the mask 710, such that sides thereof are sloped.

Then, referring to FIG. 7C, by etching an edge portion of the first conductive type semiconductor layer 620 exposed by the mesa etching and underlying substrate 610 by using the mask 710, sides of a first portion 612 of the first conductive type semiconductor layer 620 and sides of underlying substrate 610 can be formed sloped at an angle (For an example, 5°~85°) from the reference plane 601, and the sloped sides can have the concave-convex pattern 680 formed thereon, respectively. The concave-convex pattern 680 has an concave-convex structure in which a sloped direction length is greater than a lateral direction length. Since etching is shielded at the sides of the mesa structure 614, the sides of the mesa structure can be vertical. Since the first portion 612 of the first conductive type semiconductor layer 620, the reference plane 601, the mesa structure 614, the sloped direction, and the lateral direction are identical to description of the same made with reference to FIG. 6, description of which will be omitted.

Figure 8:
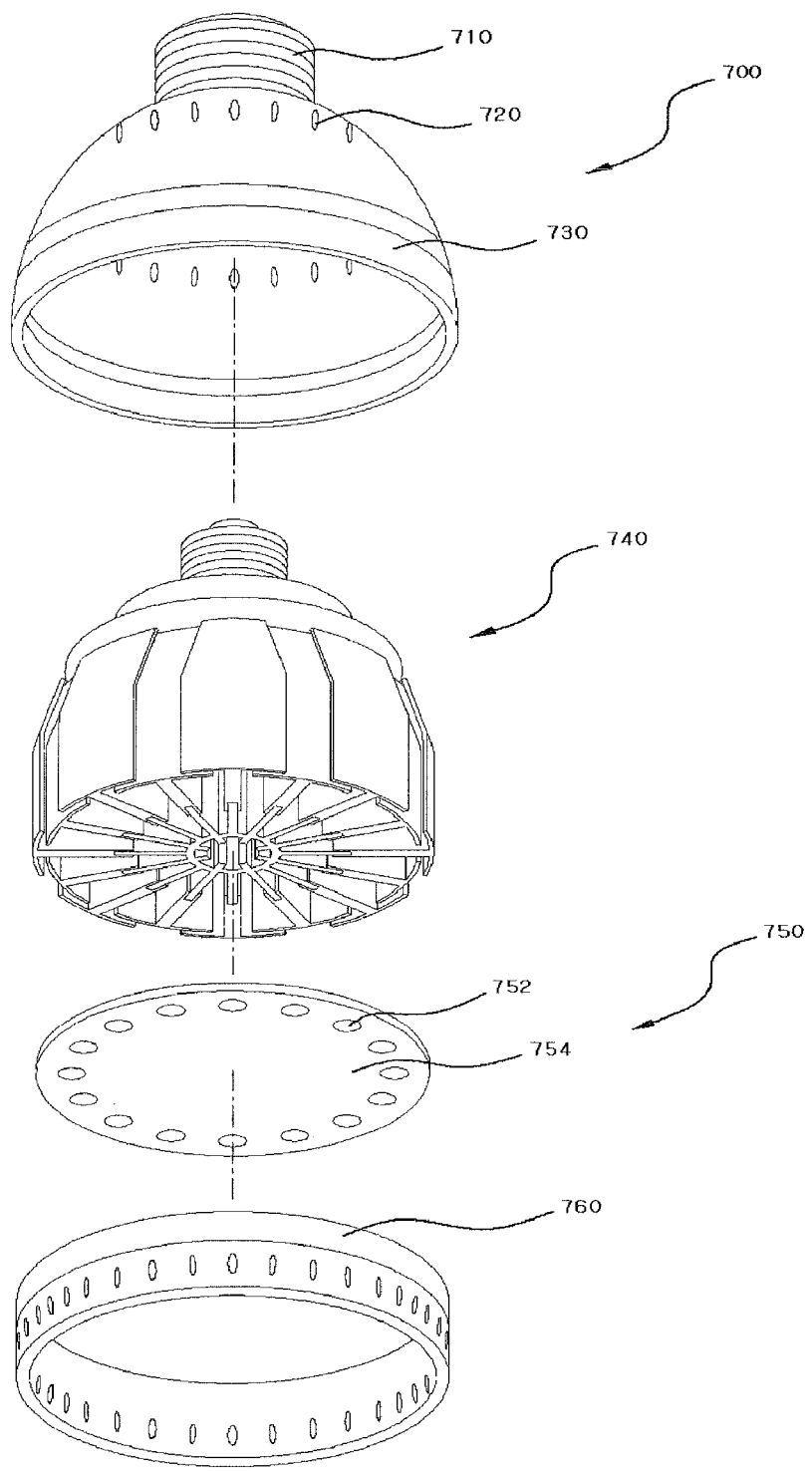
FIG. 8 illustrates an exploded perspective view of a lighting device having a light emitting device package in accordance with a preferred embodiment of the present invention applied thereto.

FIG. 8 illustrates an exploded perspective view of a lighting device system having a light emitting device package in accordance with a preferred embodiment of the present invention applied thereto. As shown in FIG. 8, the lighting device system includes a light source 750 for projecting a light, a housing 700 for housing the light source 750, a heat dissipating unit 740 for dissipating heat from the light source 750, and a holder 760 for fastening the light source 750 and the heat dissipating unit 740 to the housing 700.

The housing 700 includes a socket fastening portion 710 for fastening the housing 700 to an electric socket (not shown) and a body portion 730 connected to the socket fastening portion for housing the light source 750. The body portion 730 can have an air flow opening 720 passing therethrough.

The body portion 730 of the housing 700 has a plurality of air flow openings 720. The air flow opening 720 may be singular or plural arranged radially as shown in the drawing. Besides this, the arrangement of the air flow opening 720 can vary.

And, the light source 750 has a plurality of light emitting device packages 752 provided on a substrate 754. The substrate 754 can have a shape that can be placed in an opening of the housing 700, and can be formed of a material having high heat conductivity for transfer of heat to the heat dissipating unit 740.

And, a holder 760 is provided under the light source, including a frame and another air flow openings. Though not shown, an optical member can be provided to a lower side of the light source 750 for causing the light from the light emitting device package 752 of the light source 750 to diverge, scatter, or converge. The lighting device of the embodiment uses the light emitting device package with improved light efficiency for improving light emitting efficiency of the lighting device.

Figure 9A:
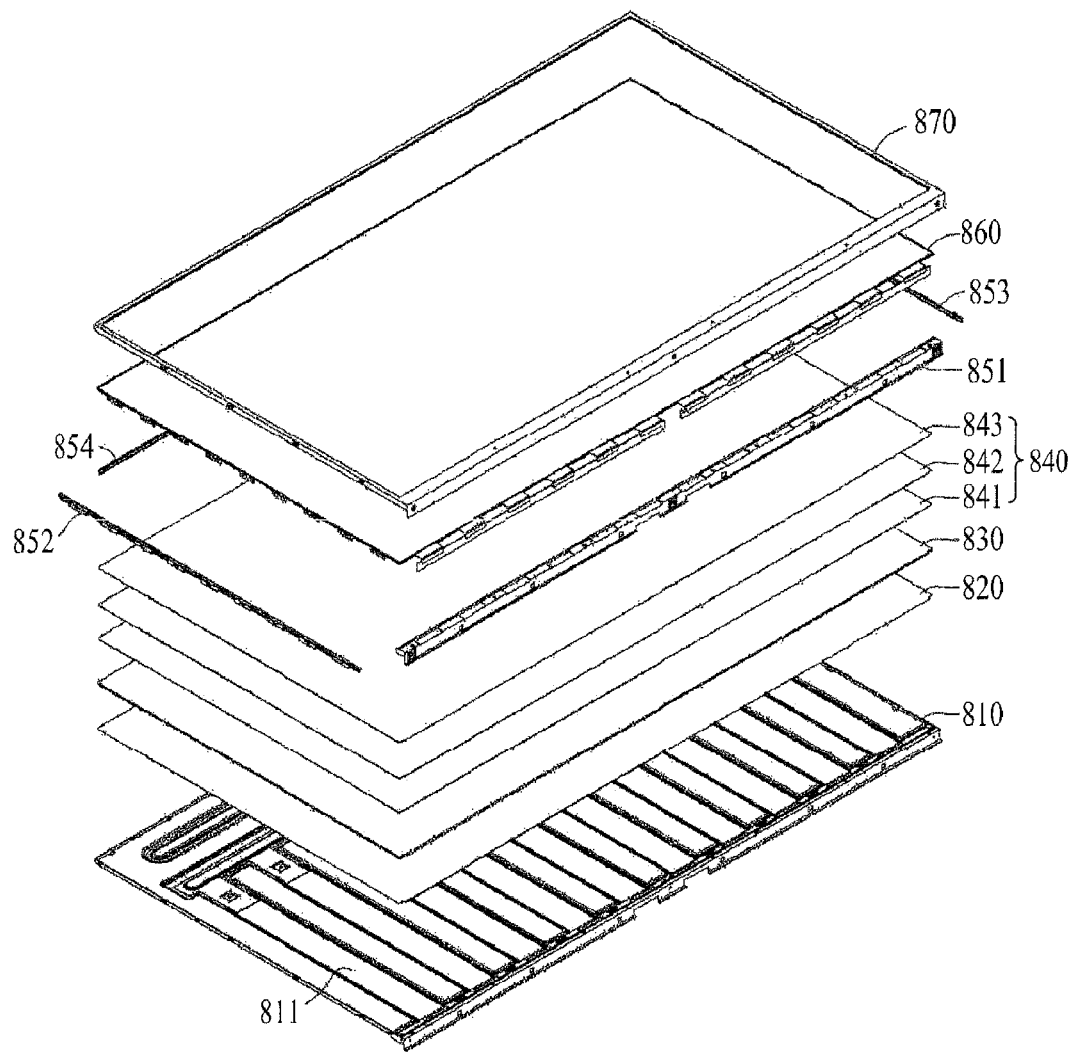
FIG. 9A illustrates an exploded perspective view of a display unit having a light emitting device package in accordance with a preferred embodiment of the present invention applied thereto.
Figure 9B:
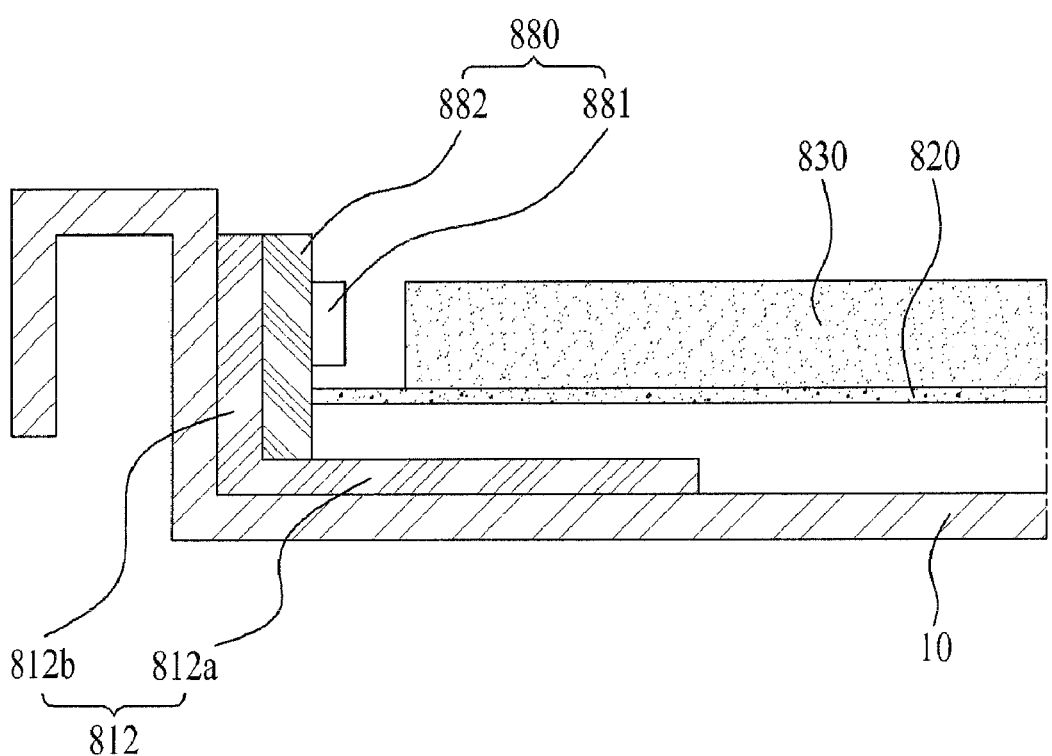
FIG. 9B illustrates a section of a light source portion of the display unit in FIG. 9A.

FIG. 9A illustrates an exploded perspective view of a display unit having a light emitting device package in accordance with a preferred embodiment of the present invention applied thereto, and FIG. 9B illustrates a section of a light source portion of the display unit in FIG. 9A.

Referring to FIGS. 9A and 9B, the display unit includes a backlight unit and a liquid crystal display panel 860, a top cover 870, and a fastening member 850.

The backlight unit includes a bottom cover 810, a light emitting module 880 on one side of inside of the bottom cover 810, a reflective plate 820 arranged on a front of the bottom cover 810, a light guide plate 830 arranged on a front of the reflective plate 820 for guiding the light from the light emitting module 880 toward a front of the display device, and an optical member 840 arranged on a front of the light guide plate 830. The liquid crystal display panel 860 is arranged on a front of the optical member 840, the top cover 870 is provided to a front of the liquid crystal display panel 860, the fastening member 850 is arranged between the bottom cover 810 and the top cover 870 and fastened together with the bottom cover 810 and the top cover 870.

The light guide plate 830 serves to guide the light from the light emitting module 880 to be emitted as a surface light source, the reflective plate 820 on a rear of the light guide plate 830 causes the light from the light emitting module 880 to be reflected toward the light guide plate 830 for improving light efficiency. However, the reflective plate 820 can be provided as a separate element as shown in the drawing, or provided as a coat of a high reflectivity material applied to the rear of the light guide plate 830 or to the front of the bottom cover 810. The reflective plate 820 can be formed of a material which has high reflectivity and can be very thin, such as PolyEthylene Terephtalate PET.

And, the light guide plate 830 scatters the light from the light emitting module 880 for uniform distribution of the light to an entire region of a screen of the liquid crystal display panel 860. Accordingly, the light guide plate 830 is formed of a material having high refractivity and transmissivity, such as PolyMethylMethAcrylate PMMA, PolyCarbonate PC, or PolyEthylene PE.

And, the optical member 840 on the light guide plate 830 causes the light from the light guide plate 830 to diverge at a predetermined angle. The optical member 840 causes the light lead by the light guide plate 830 to travel toward the liquid crystal display panel 860, uniformly.

The optical member 840 can be a selective stack of optical sheets, such as a diffusion sheet, a prism sheet, or a protective sheet or a micro-lens array. A plurality of the optical sheets can be used, and can be formed of acryl resin, polyurethane resin, or transparent resin, such as silicone resin. And, the prism sheet can contain a fluorescent sheet.

The liquid crystal display panel 860 can be provided to the front of the optical member 840. It is apparent that, instead of the liquid crystal display panel 860, other kinds of display device which requires the light source can be provided to the front of the optical member 840.

The reflective plate 820 is placed on the bottom cover 810, and the light guide plate 830 is placed on the reflective plate 820. According to this, the reflective plate 820 can be in contact with the heat dissipating member (not shown) directly. The light emitting module 880 includes a light emitting device package 882 and a printed circuit board 881. The light emitting device package 882 is mounted on the printed circuit board 881. The light emitting device package 882 can be the embodiment illustrated in FIG. 3.

The printed circuit board 881 can be bonded to a bracket 812. The bracket 812 can be formed of a material having high heat conductivity for heat dissipation in addition to fastening of the light emitting device package 882, and though not shown, a heat pad can be provided between the bracket 812 and the light emitting device package 882 for easy heat transfer. And, as shown, the bracket 812 has a "L" shape such that a transverse portion 812a is supported by the bottom cover 810 and the printed circuit board 881 is fastened to the longitudinal portion 812b.

As has been described, the light emitting device of the present invention can improve optical and electrical characteristics.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
   a substrate;
   a light emitting structure including a first conductive semiconductor layer having an exposed region, an active layer, and a second conductive semiconductor layer on the substrate;
   a first electrode on the exposed region of the first conductive semiconductor layer; and
   a second electrode on the second conductive semiconductor layer,
   wherein a side of the light emitting structure includes a first sloped side sloped from a reference plane, the first sloped side includes a concave-convex structure in which a first direction length is greater than a second direction length, the reference plane is a plane perpendicular to a direction in which the substrate faces the light emitting structure, and the first direction is a sloped direction of the first sloped side and the second direction is a lateral direction of the first sloped side.

2. The light emitting device as claimed in claim 1, wherein the first sloped side includes sides of each of the first conductive semiconductor layer, the active layer, and the second conductive semiconductor layer.

3. The light emitting device as claimed in claim 1 wherein the first sloped side includes sides of the first conductive semiconductor layer.

4. The light emitting device as claimed in claim 1, wherein the light emitting structure includes a region of the first conductive semiconductor layer exposed as the second conductive semiconductor layer, the active layer, and a portion of the first conductive semiconductor layer are mesa etched, and
   the first sloped side includes a side of a first portion of the first conductive semiconductor layer positioned between an upper surface of the first conductive semiconductor layer exposed by the mesa etching and the substrate.

5. The light emitting device as claimed in claim 1, wherein the first sloped side is sloped at an angle of 5°~85° from the reference plane.

6. The light emitting device as claimed in claim 1, wherein the concave-convex structure includes projected portions and recessed portions, and each of the projected portions and recessed portions has the first direction length greater than the second direction length.

7. The light emitting device as claimed in claim 6, wherein a sectional shape of each of the projected portion and the recessed portion in the second direction includes a square, a rectangle, and a triangle, or a curved shape, like a circle, and ellipse, or a pointed shape.

8. The light emitting device as claimed in claim 1, wherein the substrate has a second sloped side sloped from the reference plane.

9. The light emitting device as claimed in claim 8, wherein the second sloped side has a concave-convex structure in which a third direction length is greater than a fourth direction length, wherein the third direction is a sloped direction of the second sloped side, and the fourth direction is a lateral direction of the second sloped side.

10. The light emitting device as claimed in claim 9, wherein the second sloped side is in contact with the first sloped side which matches to the second slope side, and provided on the same sloped plane.

11. The light emitting device as claimed in claim 9, wherein the concave-convex structures of the first sloped side and the second sloped side which matches to the first sloped side are in contact with each other and have identical profiles.

12. The light emitting device as claimed in claim 8, wherein the second sloped side is sloped at an angle of 5°~85° from the reference plane.

13. The light emitting device as claimed in claim 8, wherein the first sloped side and the second sloped side have sloped angles from the reference plane the same with each other.

14. The light emitting device as claimed in claim 8, wherein the first sloped side and the second sloped side have sloped angles from the reference plane different from each other.

15. The light emitting device as claimed in claim 4, wherein the side of the mesa structure formed on the first portion by the mesa etching is vertical, wherein the mesa structure includes a second portion of the first conductive semiconductor layer, the active layer, and the second conductive semiconductor layer, and the second portion is a remained portion of the first conductive semiconductor layer positioned on the first portion.

16. The light emitting device as claimed in claim 1, further comprising a conductive layer on the second conductive semiconductor layer, and the second electrode is arranged on the conductive layer.

17. The light emitting device as claimed in claim 9, wherein a line which connects the first sloped side to the second sloped side is sloped at 5°~85° from the reference plane.

18. The light emitting device as claimed in claim 1, wherein the light emitting structure has a cross sectional area which becomes the greater as the light emitting structure goes from the second conductive semiconductor layer to the first conductive semiconductor layer the more.

19. A light emitting device package comprising:
a package body;
a light emitting device on the package body;
a first electrode layer and a second electrode layer provided on the package body connected to the light emitting device; and
a filling material which encloses the light emitting device,
wherein the light emitting device includes;
a substrate,
a light emitting structure including a first conductive semiconductor layer having an exposed region, an active layer, and a second conductive semiconductor layer on the substrate,
a first electrode on the exposed region of the first conductive semiconductor layer, and
a second electrode on the second conductive semiconductor layer,
wherein a side of the light emitting structure includes a first sloped side sloped from a reference plane, the first sloped side includes a concave-convex pattern having a concave-convex structure in which a first direction length is greater than a second direction length, the reference plane is a plane perpendicular to a direction in which the substrate faces the light emitting structure, and the first direction is a sloped direction of the first sloped side and the second direction is a lateral direction of the first sloped side.

20. A lighting device system comprising:
a light source having a plurality of light emitting device packages on a substrate for emitting a light;
a housing for housing the light source;
a heat dissipating unit for dissipating heat from the light source; and
a holder for fastening the light source and the heat dissipating unit to the housing,
wherein the light emitting device package includes;
a package body,
a light emitting device on the package body,
a first electrode layer and a second electrode layer provided on the package body connected to the light emitting device, and
a filling material which encloses the light emitting device,
wherein the light emitting device includes;
a substrate,
a light emitting structure including a first conductive semiconductor layer having an exposed region, an active layer, and a second conductive semiconductor layer on the substrate;
a first electrode on the exposed region of the first conductive semiconductor layer, and
a second electrode on the second conductive semiconductor layer,
wherein a side of the light emitting structure includes a first sloped side sloped from a reference plane, the first sloped side includes a concave-convex pattern having a concave-convex structure in which a first direction length is greater than a second direction length, the reference plane is a plane perpendicular to a direction in which the substrate faces the light emitting structure, and the first direction is a sloped direction of the first sloped side and the second direction is a lateral direction of the first sloped side.

* * * * *